United States Patent [19]

Blanchard

[11] Patent Number: 4,824,795
[45] Date of Patent: Apr. 25, 1989

[54] METHOD FOR OBTAINING REGIONS OF DIELECTRICALLY ISOLATED SINGLE CRYSTAL SILICON

[75] Inventor: Richard A. Blanchard, Los Altos, Calif.

[73] Assignee: Siliconix incorporated, Santa Clara, Calif.

[21] Appl. No.: 10,924

[22] Filed: Feb. 5, 1987

Related U.S. Application Data

[63] Continuation-in-part of Ser. No. 811,600, Dec. 19, 1985, abandoned.

[51] Int. Cl.$^4$ .................. H01L 21/76; H01L 21/26
[52] U.S. Cl. .................. 437/62; 148/DIG. 29; 148/DIG. 116; 156/614; 156/628; 156/657; 357/49; 437/36; 437/90; 437/99; 437/239; 437/981; 437/985
[58] Field of Search ............ 29/576 E, 576 W, 576 B, 29/576 T, 577 L, 578, 580; 148/1.5, 174, 175, 187, 33.2, DIG. 29, 116; 156/612, 613, 628, 647, 649, 657, 643; 357/44, 49, 56; 427/93, 94

[56] References Cited

U.S. PATENT DOCUMENTS

| | | | |
|---|---|---|---|
| 3,900,350 | 8/1975 | Appels et al. | 148/175 |
| 4,016,007 | 4/1977 | Wada et al. | 148/174 |
| 4,113,515 | 9/1978 | Kooi et al. | 148/1.5 |
| 4,155,783 | 5/1979 | Feist | 148/33.2 |
| 4,292,156 | 9/1981 | Matsumoto et al. | 29/578 |
| 4,323,417 | 4/1982 | Lam | 156/613 |
| 4,408,386 | 10/1983 | Takayashiki et al. | 29/576 E |
| 4,409,723 | 10/1983 | Harari | 29/571 |
| 4,433,470 | 2/1984 | Karmeyama et al. | 29/577 C |
| 4,465,705 | 8/1984 | Ishihara et al. | 427/94 |
| 4,503,601 | 3/1985 | Chiao | 29/571 |
| 4,507,158 | 3/1985 | Kamins et al. | 148/175 |

FOREIGN PATENT DOCUMENTS 0200421 11/1984 Japan .................. 29/576 W

OTHER PUBLICATIONS

Isaac et al., "Method for Fabricating a Self-Aligned Vertical PNP Transistor", IBM TDB, vol. 22 No. 8A, Jan. 1980, pp. 3393–3396.
Deal et al., "Recent Advances . . . Metal-Oxide-Silicon System," Trans. Metal. Soc. of AIME, vol. 233, Mar. 1965, pp. 524–529.
Anantha et al., "Integrated Circuits Incorporating Complementary FET Devices," IBM TDB, vol. 16 No. 10, Mar. 1974, p. 3245.
Ghandhi, "VLSI Fabrication Principles," John Wiley & Sons, New York N.Y., 1983, pp. 383–384.
Josquin, "The Oxidation Characteristics of Nitrogen-Implanted Silicon", Radiation Effects, 1980, vol. 47, pp. 221–224.
Ho et al., "Thermal Oxidation of Heavily Phosphorus-Doped Silicon", Journal of the Electrochemical Society, vol. 125, No. 4, Apr. 1978, pp. 665–671.

Primary Examiner—Brian E. Hearn
Assistant Examiner—William Bunch
Attorney, Agent, or Firm—Skjerven, Morrill, MacPherson, Franklin & Friel

[57] ABSTRACT

A method of forming single crystal islands (30) by epitaxial growth from a monocrystalline substrate (10). A <100> or other suitable low index surface is preferentially etched to void an inverted pyramid section (16) with <111> or other suitable low index sidewalls (18). The <100> bottom (17) of the pyramid section is covered with insulation (20) and island refill material (24) is grown epitaxially from the sidewalls (18). The islands (30) are laterally isolated (25, 28) from the sidewalls (13) and the structure is finished to provide a substrate on which to form various IC devices.

14 Claims, 8 Drawing Sheets

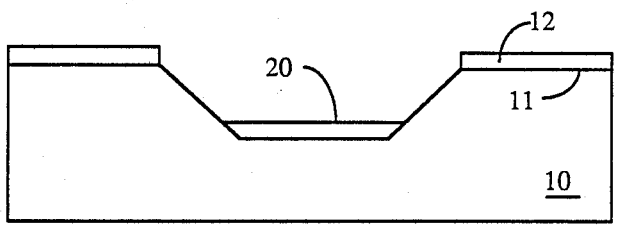
Figure 6a
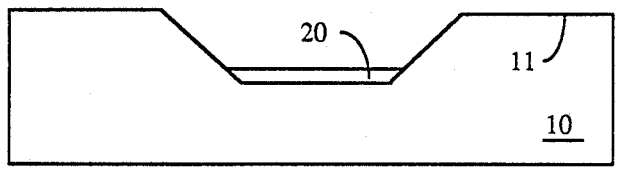
Figure 6b
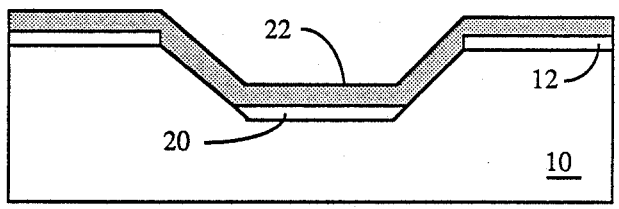
Figure 7a1

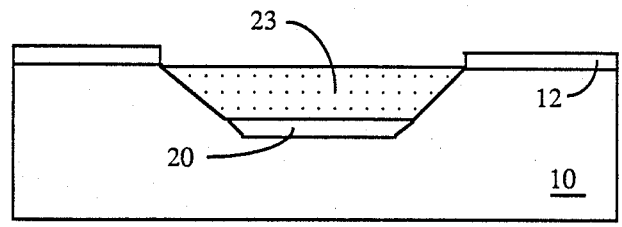
Figure 7a2
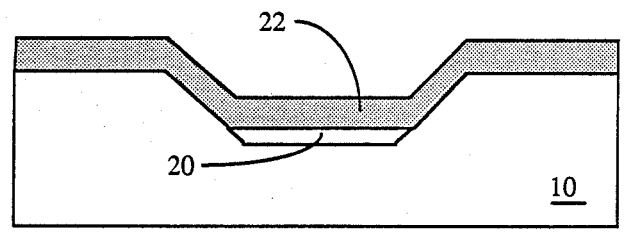
Figure 7b1
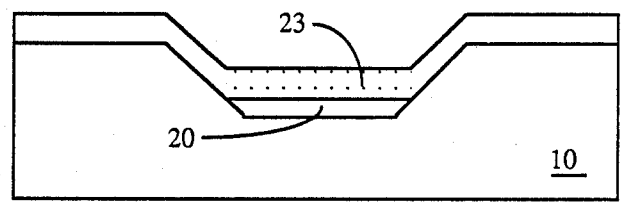
Figure 7b2

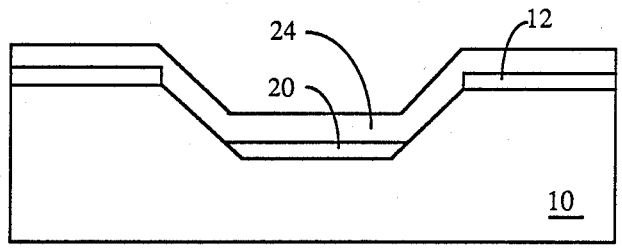
Figure 8a1
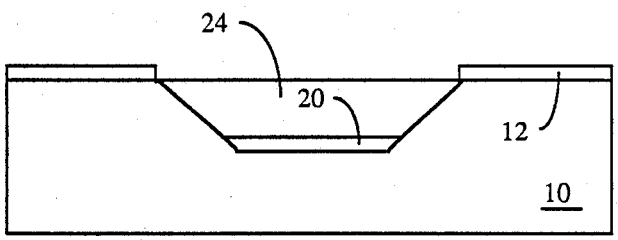
Figure 8a2
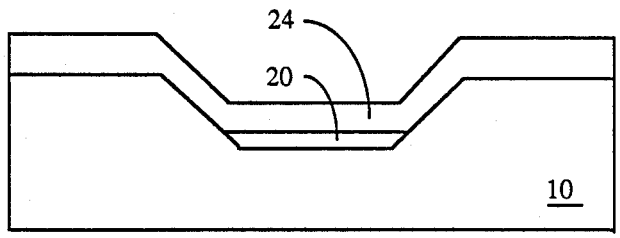
Figure 8b1
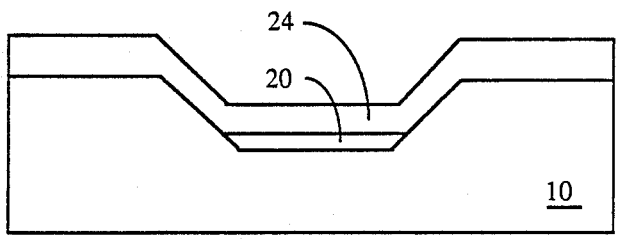
Figure 8b2

METHOD FOR OBTAINING REGIONS OF DIELECTRICALLY ISOLATED SINGLE CRYSTAL SILICON

CROSS-REFERENCE TO RELATED APPLICATION

This application is a continuation-in-part of U.S. patent application Ser. No. 06/811,600, entitled METHOD FOR OBTAINING REGIONS OF DIELECTRICALLY ISOLATED SINGLE CRYSTAL SILICON, filed Dec. 19, 1985, now abandoned, and assigned to the assignee of this invention.

BACKGROUND

The present invention relates to a method of fabricating integrated circuits, and more specifically to fabricating monocrystalline wafers supporting dielectrically isolated single crystal islands, which can be used as starting substrates for making integrated circuits or isolated discrete devices on a single substrate.

An integrated circuit (IC) or an array of discrete devices includes numerous semiconductor devices. Current leakages and parasitic capacitances between devices can interfere with the intended operation of the circuit, so in many circuits it is necessary to electrically isolate devices from one another. Several isolation techniques have been used. In junction isolation, each device is isolated by a surrounding layer of material, of the conductivity type opposite to that of the device periphery. This creates a PN junction which can be reverse-biased to block stray currents. However, junction isolation has several drawbacks. Each junction has a slight capacitance which degrades the high frequency response of the circuit. A small, thermally generated current across the reverse-biased junction is facilitated by the large collector-like area outside the junction. PN junctions subjected to ionizing radiation generate photocurrents which are objectionable and may even destroy the junctions. Some applications require voltage differences that would cause unwanted current flow or breakdown in the junction(s) between neighboring devices, prohibiting the use of junction isolation. Finally, junction difuusions have significant lateral dimensions, which geometrically limit circuit density. Because IC cost is proportional to circuit size, circuit elements should be as small as possible, especially in large scale integration (LSI) circuits.

For improved frequency response, radiation immunity, and electrical isolation, IC devices are often separated by highly resistive or "dielectric" regions, rather than by PN junctions. Several prior art dielectric isolation techniques provide a single crystal silicon island over a thin layer of dielectric material, such as silicon dioxide, which insulates the single crystal from the underlying support wafer.

A monocrystalline silicon wafer can be ion implanted, as in U.S. Pat. No. 3,855,009, to form an insulating layer of silicon oxide, silicon carbide, or silicon nitride, buried about 0.4 microns beneath the wafer surface. Damage to the surface caused by ion bombardment can be largely repaired by annealing, leaving a surface of reasonably high quality monocrystalline silicon, on which epitaxial silicon can be grown. This technique forms only thin isolating layers and processes bulk silicon at high cost, since it requires an expensive, high-energy, ion implanting machine. A subsequent epitaxial deposition is needed to form the silicon region for most types of circuits.

A common process for forming dielectrically isolated single crystal islands starts with a monocrystalline silicon wafer. Single crystal regions for the islands may be constituted by subsurface regions of the wafer, which are laterally separated either initially (by V-grooves, as in U.S. Pat. No. 4,468,414) or after other steps (by etching, as in U.S. Pat. No. 4,056,414). Or, the islands may be formed by growing epitaxial silicon from the exposed wafer surface through seed windows in a patterned dielectric layer (U.S. Pat. Nos. 3,850,707 and 3,756,877). Wherever the islands are formed, their tops are covered with a dielectric (oxide) layer, and a thick polycrystalline support layer is grown over the entire wafer. Next, the wafer is turned upside down and the original substrate is removed, typically by lapping and/or grinding and polishing, to the level of the final single-crystal island surface. For subwafer surface islands, this level is at the depth of the islands beneath the wafer surface; for on-surface islands, this level is at the original wafer surface. If the island regions are not already laterally separated, this is done.

A polycrystalline support layer has the disadvantage of not being as strong as monocrystalline silicon. Also, polycrystalline and monocrystalline silicon have different thermal coefficients of expansion, causing a slight warp between the islands and interfering with lapping the wafer to a final, precise island thickness.

These problems would be avoided if the support wafer were monocrystalline, but deposited silicon grows in polycrystalline form on an $SiO_2$ insulating layer. One way of obtaining a monocrystalline support is to grow monocrystalline silicon heteroepitaxially onto a crystalline insulating substrate, such as sapphire (aluminum oxide) or spinel (aluminum magnesium oxide). However, these insulators have crystal structures that do not quite match that of silicon, and growing silicon crystal on a mismatched lattice produces interface stresses and stacking faults. These crystal defects prevent the epitaxial disposition of silicon islands of satisfactory uniformity for use as starting substrates in which to form high quality, active devices such as bipolar transistors and DMOS transistors. Finally, aluminum oxides and monocrystalline silicon have different temperature coefficients of expansion, which create further interface stresses at temperature extremes.

Polycrystalline supports can also be replaced by bonding a monocrystalline support layer above the insulation, as in U.S. Pat. Nos. 4,411,060 (metallic bonding), and 3,909,322 (glass fusion). However, bonding requires a "glue" layer, which is fused by heat and pressure. Such bondings may fail at high temperatures. Alternatively, if epitaxially grown islands can be isolated from their seeding areas, then the original monocrystalline wafer support can be saved. This avoids the steps of growing polycrystalline silicon and removing monocrystalline silicon, and the mechanical deficiencies of polycrystalline supports. In U.S. Pat. No. 4,461,670, an insulating pattern is deposited on a monocrystalline wafer, then island silicon is deposited, in polycrystalline form over insulation and in epitaxial monocrystalline form over seeding windows. The polycrystalline silicon is melted and, under a carefully controlled temperature gradient, recrystallized from the seeding windows up through holes in, and across, the insulation. The seeding windows are removed and replaced with insulation to complete the isolation of the islands. However, such melting has the drawback of needing a "capping" layer over the island material to prevent it from bunching up or "balling" and becoming uneven. Nucleation of single crystal silicon in this fashion has only been used for low voltage MOS transistors.

There remains a need, therefore, for a method of producing dielectrically isolated, single crystal islands in monocrystalline wafers, that can subsequently be used for manufacturing a variety of devices.

SUMMARY

It is therefore an object of this invention to provide single crystal islands epitaxially grown on and isolated from a monocrystalline support wafer. While the following description refers to the use of silicon, and selected lattice planes, it is to be understood that this invention may be practiced using any suitable semiconductor material.

In one embodiment, the present invention achieves this object by, first, preferentially etching a <100> Miller index surface of a monocrystalline silicon wafer in a rectangular area paralleling the <100> plane lattice, to form an inverted pyramidal section, having sidewalls in <111> planes converging towards a <100> plane at the flat and rectangular or square bottom of the section. At least the bottom surface of the section is heavily doped with phosphorus, to increase the rate by which oxide will grow faster on the <100> bottom plane than on the <111> sidewall planes. Next, an oxide insulating layer is thermally grown on the exposed silicon. Due to doping, the layer of oxide on the bottom of the etched region is thicker than that on the sides of the etched region. The oxide is nonpreferentially etched enough to remove any sidewall deposits of oxide, yet not enough to remove all of the bottom insulating layer. The pyramid space is refilled by selective epitaxial silicon growth from the <111> sidewalls, and annealed as necessary to improve the refill lattice regularity. A vertical insulation wall is formed around the periphery of the refill, or a selected portion thereof, to isolate a single-crystal island from the wafer. This procedure allows the original wafer to be retained as the island support structure, and avoids the drawbacks of providing a replacement support by growing a polycrystalline silicon layer or bonding a second monocrystalline wafer onto the insulated island, as well as avoiding grinding off the original monocrystalline wafer. The wafer structure at this stage may be used as the starting substrate for a variety of devices or integrated circuits. The single crystal island conductivity and thickness can be controlled very accurately. The invention thus simplifies the preparation, and lowers the cost, of single-crystal island substrates, and facilitates improving the yield and quality of devices subsequently fabricated on the island substrates. The invention process may be practiced on different scales to form large or small area islands, and can form numerous islands simultaneously on one wafer.

BRIEF DESCRIPTION OF THE DRAWINGS

FIGS. 6a and 6b show alternative steps following the step of FIG. 5.

FIGS. 7a(1) and 7a(2) show alternative steps following the step of FIG. 6a.

FIGS. 7b(1) and 7b(2) show alternative steps following the step of FIG. 6b.

FIGS. 8a(1), 8b(1) and 8b(2) show the steps following respective steps of FIG. 7.

DETAILED DESCRIPTION

Islands of single crystal silicon individually surrounded by a dielectric insulating layer such as $SiO_2$ on a support wafer are useful as starting substrates on which a variety of circuits and arrays can be manufactured. The insulating layers electrically isolate the islands from the support wafer and from each other, even under high electric fields, illumination, or radiation, which otherwise would interfere with the normal operation of circuits fabricated on the islands. The inventive process, which is explained without specifying area magnitudes, may be carried out on different scales to obtain a single large isolated island covering substantially all of the surface of, for example a six inch diameter wafer, or many small islands simultaneously on one wafer. For the sake of clarity, only one island formation is illustrated.

Figure 1:
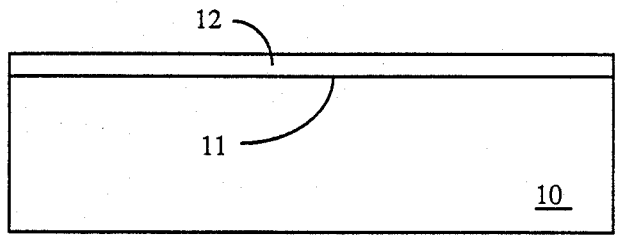
FIGS. 1, 2, and 3 are cross sections of a wafer showing the first steps in practicing the invention.

Referring to FIG. 1, the process starts with a monocrystalline silicon wafer 10 which has a top surface 11 in a low crystal index plane, preferably the <100> plane. Preferentially etching <100> silicon provides a recess having a square or rectangular and flat bottom surface (17, FIG. 3) and also provides nucleation sites on sidewalls (18, FIG. 3) that are at an angle to surface 11. Other low index crystal surfaces do not have all of the advantages of <100> silicon and are less preferable for top surface 11. A layer of masking material 12, preferably a dielectric such as $SiO_2$ or a sandwich of $SiO_2$/$Si_3N_4$, is formed on surface 11 by thermal oxidation and/or by chemical vapor deposition (CVD).

Figure 2:
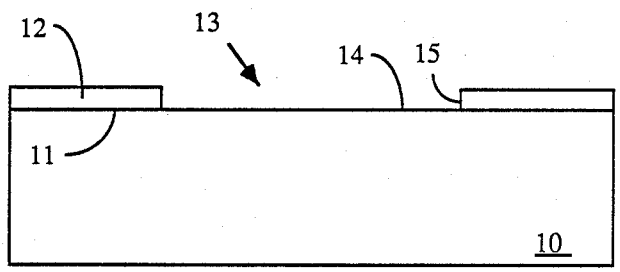
Figure 9:
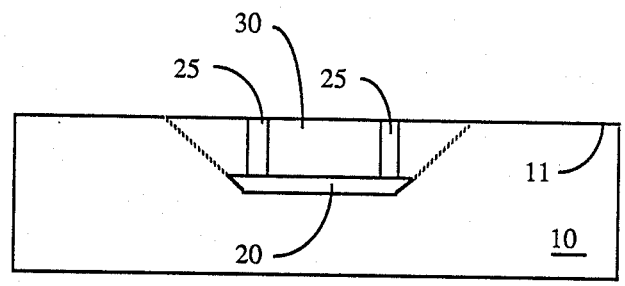
FIG. 9 shows a step by which the epitaxial refill is laterally isolated to form an island.

Referring to FIG. 2, window 13 is opened in dielectric layer (or sandwich) mask 12, using standard photomasking and etching techniques, to expose surface 11 in a rectangular or square area 14 beneath which an island (island 30, FIG. 9) is to be formed. To etch wafer 10 correctly, mask 12 is aligned with its edges 15 parallel to the lattice of the <100> plane in wafer surface 1.

Figure 3:
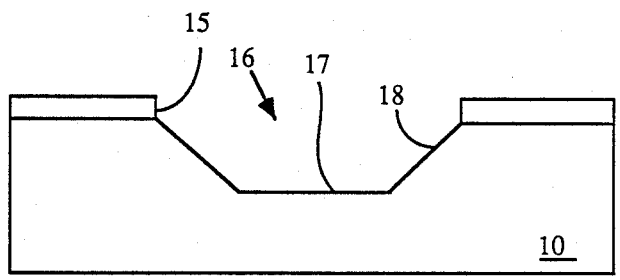

The exposed wafer area 14 is then preferentially etched normal to the <100> plane to remove silicon in a four sided inverted pyramid section 16, as shown in trapezoid cross section in FIG. 3. Any of several etching fluids, such as potassium hydroxide (KOH) and ethylene diamine pyrocatechol, are suitable for this step. If rectangular area 14 is not square, then the "pyramid" section 16 etched away is not, strictly speaking, a pyramid section, because the planes of the long sidewalls intersect at less depth than do the planes of the short sidewalls. Whether rectangular pyramid base area 14 is square or not, section 16 is preferably etched to a bottom level 17 forming a flat surface at less than the depth at which the planes of the sidewalls intersect. The depth of etching, typically 0.5 to 1.5 microns, is a factor in determining the depth of the later silicon refill (22, 23, FIGS. 7) that will provide the single crystal island (30, FIG. 9).

Figure 3A:
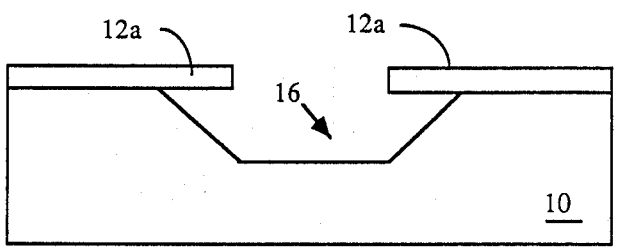
FIGS. 3a and 3b show alternate steps for doping the wafer before or after the step of FIG. 3, respectively.
Figure 4:
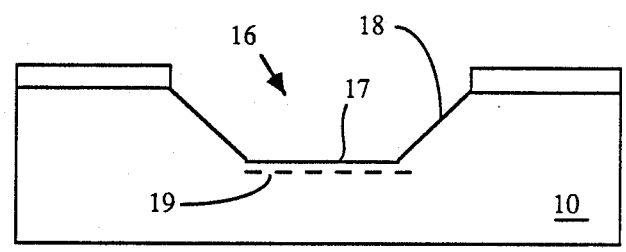
FIGS. 4 and 5 show steps performed after a pyramidal section with a doped bottom is obtained.

This invention is practiced upon epitaxial wafers 10 doped with a material suitable to enable dielectric layers to be formed at different rates on different crystal surfaces depending on the crystal indexes of the surfaces. This material is preferably phosphorus in a concentration of approximately $5 \times 10E19$ atoms/cm$^3$ or more in the wafer. Wafer 10 may be originally doped during its manufacture, or if wafer 10 is not already doped with at least this concentration of phosphorus, bottom surface 17 only is doped, by either of two doping methods. In one doping method, prior to the preferential etch of pyramid section 16 shown in FIG. 3, exposed surface 14 is nonpreferentially etched to undercut surface dielectric 12, which leaves an overhang 12a as shown in FIG. 3a. Wafer 10 is then preferentially etched to form pyramid section 16, and is then implanted with phosphorus ions, which are prevented by overhang 12a from reaching sidewalls 18 but which penetrate bottom 17 as indicated by minus marks 19 in FIG. 4.

Figure 3B:
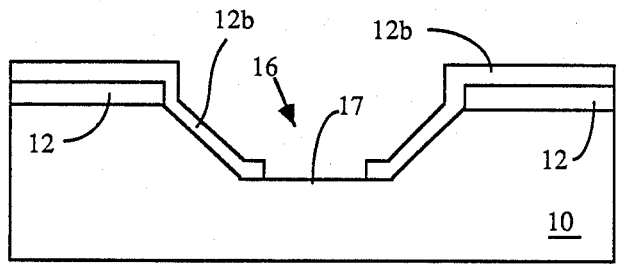

In the alternate doping method, pyramid section 16 is preferentially etched as shown in FIG. 3, and then dielectric 12, sidewalls 18, and bottom 17 are all covered with thermally grown oxide 12b as shown in FIG. 3b. A window is opened in oxide 12b only over bottom surface 17, which is then phosphorus doped either by thermal predeposition or by ion implantation as indicated by minus marks 19 in FIG. 4. Any oxide 12a or 12b extending into pyramid section 16 is then removed.

Figure 5:
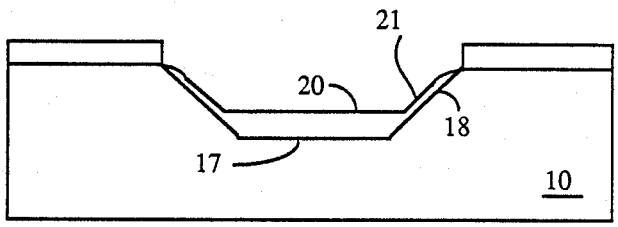

Once the surfaces of pyramid section 16 are doped appropriately, wafer 10 is oxidized in wet $O_2$ at a temperature in the range of 750 to 850 degrees centigrade, where $<100>$ plane surfaces in silicon doped heavily with phosphorus oxidize significantly faster than lightly doped $<111>$ plane surfaces. As shown in FIG. 5, this results in an oxide layer 20 which is 3000 to 9000Å thick on the bottom 17 of the pyramid section this considerably thicker than layer 21, which is 1000 to 3000Å thick on sides 18.

The oxidized wafer 10 is nonpreferentially etched, using either a wet or a dry etch technique, long enough to remove all of SiO$_2$ layer 21 from sidewalls 18, but not all of SiO$_2$ layer 20 from bottom 17. The remaining layer 20 is 2000–6000Å thick. If original masking layer 12 is of a material such as SiO$_2$ which is etched as the SiO$_2$ layer 21 is etched, it will be thinned (FIG. 6a) or completely etched (FIG. 6b) during this step, depending on its original thickness. Otherwise, if for example a nitride masking sandwich was used, it will remain and will require a separate etching step to be removed. Whether the masking layer 12 remains, is thinned, or is completely removed during this step is unimportant in the practice of the invention, but may be of concern with regard to subsequent processing steps, which are not part of the present invention.

Silicon refill for the to-be-formed islands (30) is then deposited either in polycrystalline form 22 as in FIG. 7a1 and 7b1 where the masking layer 12 has been left in place or removed, respectively, or in monocrystalline form 23 as in FIGS. 7a2 and 7b2 where the masking layer 12 has likewise been left in place or removed, respectively. Single crystal silicon 23 is formed, for Example, at a temperature in the range of 1000° C. to 1200° C. using SiH$_4$, SiH$_2$, SiHCl$_3$, or SiCl$_4$. Polycrystalline silicon 22 is formed, for example, at a temperature in the range of 600° C. to 700° C. using SiH$_4$. Although this deposition of silicon 22 or 23 is over an SiO$_2$ layer 20 which would ordinarily result in the formation of polycrystalline silicon, substantially monocrystalline silicon 23 is obtained by selective epitaxial growth from the $<111>$ crystal planes in sidewalls 18, which propagates across the top of insulation layer 20.

Next, the silicon 22 or 23 refilled in the step shown in FIGS. 7a1, 7a2, 7b1, or 7b2 is regrown in the respective steps of FIGS. 8a1, 8a2, 8b1, or 8b2, in order to improve refill lattice regularity. Any of several well-known silicon regrowth techniques including electron beam, laser beam, heater strip, light irradiation and others, may be used to recrystallize polycrystalline silicon 22, or further crystallize monocrystalline silicon 23, into higher quality monocrystalline silicon epitaxial refill 24.

Figure 10A:
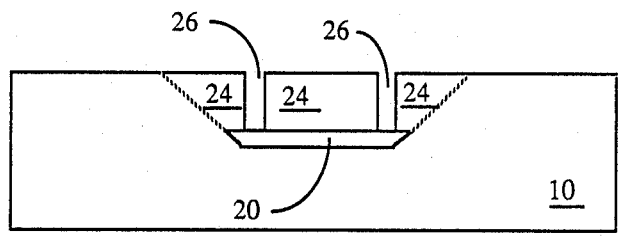
FIGS. 10a through 10e show steps of an alternate method by which the epitaxial refill island is laterally isolated to form an island.
Figure 10B:
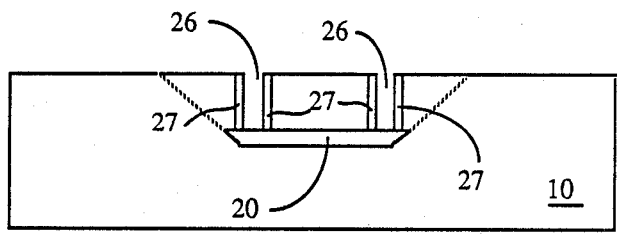
Figure 10C:
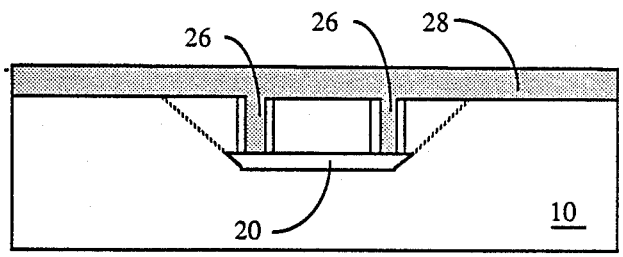
Figure 10D:
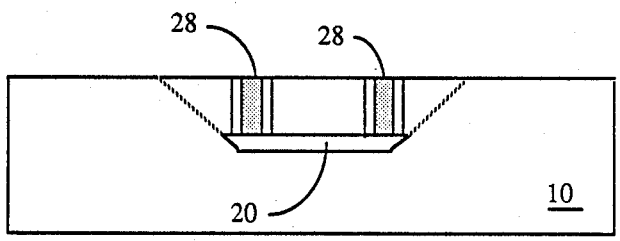
Figure 10E:
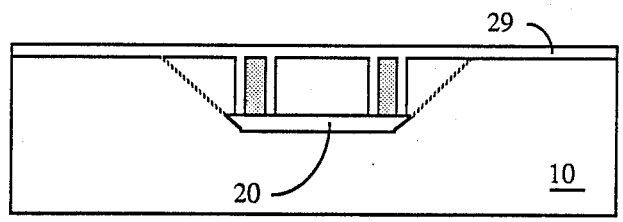

Epitaxial refill 24 is isolated laterally from wafer 10 and other refills 24, not shown. This can be done, for example, by growing oxide 25 through the refill 24 inside the periphery of insulating layer 20 as shown in cross section in FIG. 9. Alternatively, refill 24 can be isolated by etching a groove or trench 26 as shown in FIG. 10a, growing a thermal SiO$_2$ layer 27 over the etched surface as in FIG. 10b, then refilling trench 26 using polycrystalline silicon 28 or other suitable material, FIG. 10c. The top of the layer of polycrystalline silicon 28 is removed as shown in FIG. 10d, and capped with a thermally grown SiO$_2$ layer 29 as shown in FIG. 10d, in order to electrically insulate polycrystalline silicon 28 from conductive layers (not shown) to be formed subsequently.

Figure 11:
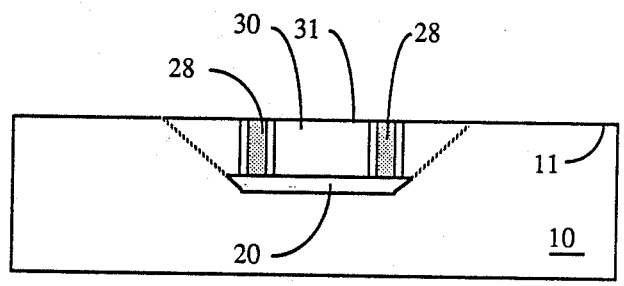
FIG. 11 shows the structure produced by the steps of FIGS. 10a through 10e.

Finally the top surface of epitaxial refill 24 and the original wafer surface 11 may then be coplanarized as necessary using conventional masking and etching, and/or mechanical, techniques to produce an island 30 with a surface 31, FIG. 11, useful as a substrate on which to form devices in further steps, which do not form part of this invention.

Figure 12:
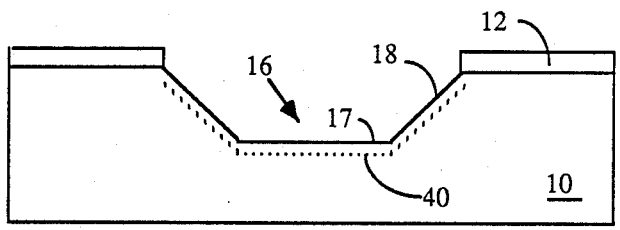
Figure 13:
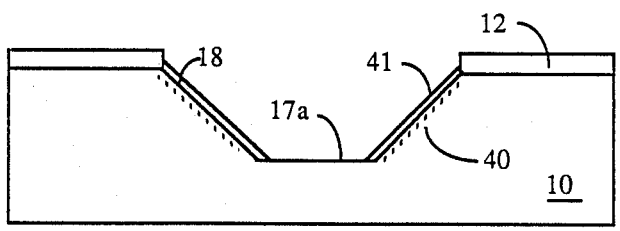

As an alternative to phosphorus doping, and as a preferred embodiment, the bottom surface 17 and sidewalls 18 may be implanted with nitrogen atoms (the oxide layer 12 acting as a mask therefor), as indicated at 40 in FIG. 12. Preferably, the implant dose of nitrogen is approximately $10^{15}$/cm$^2$ or more in the wafer. The pyramid section 16 is then preferentially etched so that some of the bottom surface 17 (including that portion of wafer 10 containing the nitrogen implant ions immediately below that surface 17) is etched away, while the sidewalls 18 are unaffected, so that the resulting structure is as shown in FIG. 13, with implanted nitrogen 40 remaining only in the sidewalls 18 and not below the new bottom surface 17a. The wafer is then annealed to form a Si$_3$N$_4$ layer 41 on the sidewalls 18 which still have implanted nitrogen present. This anneal step is described in the article "The Oxidation Inhibition of Nitrogen Implanted Silicon" by W.J.M.J. Josquin and Y. Tamminga, published in The Journal of the Electrochemical Society, Vol. 129, No. 8, pages 1803–1810 (August 1982).

Figure 14:
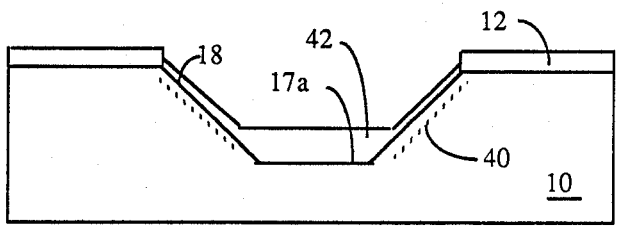

As described in the paper entitled "The Oxygen Characteristics of Nitrogen-Implanted Silicon" by W.J.M.J. Josquin, published in Radiation Effects, 1980, Vol. 47 at pages 221–224, the addition of nitrogen atoms in silicon retards the oxidation thereof. Upon the wafer 10 being oxidized in wet $O_2$ at a temperature in the range of 900°–1100° C., the $<100>$ plane surface 17a undoped by nitrogen will oxidize significantly faster than the $<111>$ plane surfaces 18, which are doped with nitrogen. (In the process as shown, the Si$_3$N$_4$ layer is oxidized also, but under certain circumstance as chosen the Si$_3$N$_4$ layer may remain.) As shown in FIG. 14, this results in an oxide layer 42 which is considerably thicker on the bottom surface 17a than on the sidewalls 18. It will be seen that the resulting structure is similar to that previously described in reference to FIG. 5.

Figure 15:
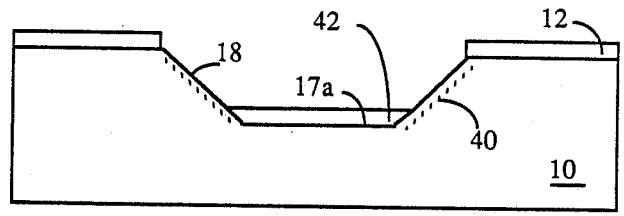
FIGS. 12-15 show an alternative approach to that shown in FIGS. 4 and 5.

Etching of the oxide layer 42 achieves a structure as shown in FIG. 15 similar to that shown in FIG. 6a.

Subsequent steps are undertaken as previously described to further the process.

Various embodiments have been illustrated, of which modifications and adaptations within the scope of the invention will occur to those skilled in the art. The invention is limited only by the scope of the following claims.

I claim:

1. The process for forming a dielectrically-isolated single-crystal island in a monocrystalline wafer substrate comprising the steps of:
   providing a monocrystalline semiconductor wafer having a top surface in a low crystal index plane;
   masking the top surface mask material, leaving the surface exposed in a window area with rectangular sides parallel to the lattice of said crystal plane in the top surface;
   etching the exposed wafer surface preferentially normal to the top surface plane, to remove an inverted pyramid section having a flat bottom surface and with sidewall surfaces converging towards the bottom surface;
   providing a dielectric layer on the bottom surface only of the pyramid section;
   refilling the pyramid section with semiconductor refill above the dielectric;
   providing that the semiconductor refill is epitaxial with the monocrystalline semiconductor material of the sidewalls, to constitute a single crystal refill; and
   laterally isolating the single crystal between its surface and the dielectric layer,
   wherein the step of providing a dielectic layer includes:
   providing that at least the bottom surface of the pyramid section is heavily doped with phosphorus;
   forming a layer of dielectric on the pyramid section surface, substantially thicker on the bottom surface than on the sidewall surfaces; and
   nonpreferentially etching the layer of dielectric so that there is dielectric on the bottom surface but no dielectric on the sidewalls.

2. A process as in claim 1 wherein the bottom surface is doped with phosphorus to a concentration of at least $5 \times 10E19/cm^3$.

3. A process as in claim 1, further characterized in that the step of providing that at least the bottom surface of the pyramid section is doped includes providing a monocrystalline wafer substrate heavily doped with phosphorus, and over which there is an epitaxial layer not heavily doped with phosphorus.

4. A process as in claim 1, further characterized in that the step of providing that at least the bottom surface of the pyramid section is doped includes doping the bottom surface after it is exposed by the preferential etching step.

5. A process as in claim 4 wherein the step of providing that the bottom surface of the pyramid section is doped includes nonpreferentially etching the wafer surface exposed in the window area to leave a portion of the mask material overhanging the nonpreferentially etched wafer surface, before the preferential etching step, and
after the preferential etching step, ion implanting the bottom surface of the pyramid section while the overhanging mask material prevents ions from reaching the sidewall surfaces.

6. A process as in claim 4 wherein the step of providing that the bottom surface of the pyramid section is doped includes,sidewall surfaces of the pyramid section with mask material, after the preferential etching step, masking leaving the bottom surface exposed, and then doping the exposed bottom surface.

7. A process as in claim 1 wherein the dielectric is an oxide of silicon.

8. A process as in claim 1 wherein the oxide is formed from wet $O_2$.

9. A process as in claim 1, further characterized in that the step of providing that the semiconductor refill is epitaxial includes selective epitaxial deposition in the refilling step.

10. A process as in claim 1, further characterized in that: the step of providing that the semiconductor refill is epitaxial includes annealing the semiconductor refill after the refilling step.

11. A process as in claim 1, further characterized in that a plurality of single-crystal islands are formed simultaneously on a common monocrystalline wafer.

12. The process for forming a semiconductor device comprising the steps of:
   providing a monocrystalline semiconductor wafer having a top surface in a low crystal index plane;
   masking the top surface with mask material, leaving the surface exposed in a window area with rectangular sides parallel to the lattice of said crystal plane in the top surface;
   etching the exposed wafer surface preferentially normal to the top surface plane, to remove an inverted pyramid section having a flat bottom surface and with sidewall surfaces converging toward the bottom surface;
   providing that at least the bottom surface of the pyramid section is heavily doped with phosphorus;
   growing a layer of dielectric on the pyramid section surface, substantially thicker on the bottom surface than on the sidewall surfaces;
   nonpreferentially etching the layer of dielectric so that there is dielectric on the bottom surface but no dielectric on the sidewalls.

13. The method of claim 12 wherein the wafer is silicon, and wherein the dielectric is oxide.

14. The process for forming a dielectrically-isolated single-crystal island in a monocrystalline wafer substrated comprising the steps of:
   providing a monocrystalline semiconductor wafer having a top surface;
   masking the top surface with mask material, leaving the surface exposed in a window area;
   etching the exposed wafer surface to thereby form a groove in said window area, said groove having sidewalls and a bottom surface;
   providing a dielectric layer on the bottom surface only of the groove;
   refilling the groove with semiconductor refill above the dielectric;
   providing that the semiconductor refill is epitaxial with the monocrystalline semiconductor material of the sidewalls of the groove, to constitute a single crystal refill;

laterally isolating the single crystal between its surface and the dielectric layer, wherein the step of providing a dielectric layer includes:

providing that at least the bottom surface of the groove is heavily doped with an oxidation rate enhancing impurity;

forming a layer of dielectric on the surface of the groove, substantially thicker on the bottom surface than on the sidewalls; and nonpreferentially etching the layer of dielectric so that three is dielectric on the bottom surface but no dielectric on the sidewalls.

* * * * *

UNITED STATES PATENT AND TRADEMARK OFFICE
CERTIFICATE OF CORRECTION

PATENT NO. : 4,824,795

DATED : April 25, 1989

INVENTOR(S) : Richard A. Blanchard

It is certified that error appears in the above-identified patent and that said Letters Patent is hereby corrected as shown below:

Col. 1, line 45, "difuusions" should read --diffusions--.

Col. 2, line 54, "Alternatively" should start a new paragraph.

Col. 4, line 53, "wafer surface 1" should read --wafer surface 11--.

Col. 8, lines 9-14, Claim 6, please delete Claim 6 and replace with the following:

--6. A process as in Claim 4 wherein the step of providing that the bottom surface of the pyramid section is doped includes, after the preferential etching step, masking sidewall surfaces of the pyramid section with mask material, leaving the bottom surface exposed, and then doping the exposed bottom surface.

UNITED STATES PATENT AND TRADEMARK OFFICE
CERTIFICATE OF CORRECTION

PATENT NO. : 4,824,795

DATED : April 25, 1989

INVENTOR(S) : Richard A. Blanchard

Page 2 of 2

It is certified that error appears in the above-identified patent and that said Letters Patent is hereby corrected as shown below:

Col. 10, line 7, Claim 14, "three" should read --there--.

Signed and Sealed this

Twenty-eighth Day of November 1989

Attest:

JEFFREY M. SAMUELS

*Attesting Officer*     *Acting Commissioner of Patents and Trademarks*